(12) United States Patent
Ishikawa et al.

(10) Patent No.: US 7,674,337 B2
(45) Date of Patent: Mar. 9, 2010

(54) GAS MANIFOLDS FOR USE DURING EPITAXIAL FILM FORMATION

(75) Inventors: David Ishikawa, Mountain View, CA (US); Craig R. Metzner, Fremont, CA (US); Ali Zojaji, Santa Clara, CA (US); Yihwan Kim, Milpitas, CA (US); Arkadii V. Samoilov, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 17 days.

(21) Appl. No.: 11/697,516

(22) Filed: Apr. 6, 2007

(65) Prior Publication Data
US 2007/0259112 A1    Nov. 8, 2007

Related U.S. Application Data

(60) Provisional application No. 60/790,227, filed on Apr. 7, 2006.

(51) Int. Cl.
*C23C 16/00* (2006.01)
*C30B 11/00* (2006.01)

(52) U.S. Cl. .................. 118/715; 117/200; 315/111.21; 315/231.31; 315/111.91

(58) Field of Classification Search ................. 118/715, 118/723–725; 315/111.21, 231.31, 111.91
See application file for complete search history.

(56) References Cited

U.S. PATENT DOCUMENTS

| | | |
|---|---|---|
| 3,675,619 A | 7/1972 | Burd |
| 4,429,324 A | 1/1984 | Wilkens |
| 4,834,831 A | 5/1989 | Nishizawa et al. |
| 5,112,439 A | 5/1992 | Reisman et al. |
| 5,236,545 A | 8/1993 | Pryor |
| 5,273,930 A | 12/1993 | Steele et al. |
| 5,288,658 A | 2/1994 | Ishihara |
| 5,294,286 A | 3/1994 | Nishizawa et al. |
| 5,360,760 A | 11/1994 | Hayashi |
| 5,372,860 A | 12/1994 | Fehlner et al. |
| 5,374,570 A | 12/1994 | Nasu et al. |
| 5,469,806 A | 11/1995 | Mochizuki et al. |
| 5,480,818 A | 1/1996 | Matsumoto et al. |
| 5,503,875 A | 4/1996 | Imai et al. |

(Continued)

FOREIGN PATENT DOCUMENTS

EP    1 150 345 A2    10/2001

(Continued)

OTHER PUBLICATIONS http://www.merriam-webster.com/dictionary/manifold[4].*

(Continued)

*Primary Examiner*—Robert M Kunemund
*Assistant Examiner*—G. Nagesh Rao
(74) *Attorney, Agent, or Firm*—Dugan & Dugan, PC (57) ABSTRACT

The present invention provides methods, systems, and apparatus for epitaxial film formation that includes an epitaxial chamber adapted to form an epitaxial layer on a substrate; a deposition gas manifold adapted to supply at least one deposition gas and a carrier gas to the epitaxial chamber; and an etchant gas manifold, separate from the deposition gas manifold, and adapted to supply at least one etchant gas and a carrier gas to the epitaxial chamber. Numerous other aspects are disclosed.

12 Claims, 4 Drawing Sheets

U.S. PATENT DOCUMENTS

| | | | |
|---|---|---|---|
| 5,521,126 A | 5/1996 | Okamura et al. | |
| 5,527,733 A | 6/1996 | Nishizawa et al. | |
| 5,674,304 A | 10/1997 | Fukada et al. | |
| 5,693,139 A | 12/1997 | Nishizawa et al. | |
| 5,796,116 A | 8/1998 | Nakata et al. | |
| 5,807,792 A | 9/1998 | Ilg et al. | |
| 5,849,092 A * | 12/1998 | Xi et al. | 134/1.1 |
| 5,906,680 A | 5/1999 | Meyerson | |
| 5,916,365 A | 6/1999 | Sherman | |
| 6,025,627 A | 2/2000 | Forbes et al. | |
| 6,042,654 A | 3/2000 | Comita et al. | |
| 6,055,927 A * | 5/2000 | Shang et al. | 118/723 ME |
| 6,110,291 A | 8/2000 | Haruta et al. | |
| 6,124,158 A | 9/2000 | Dautartas et al. | |
| 6,144,060 A | 11/2000 | Park et al. | |
| 6,159,852 A | 12/2000 | Nuttall et al. | |
| 6,200,893 B1 | 3/2001 | Sneh | |
| 6,207,487 B1 | 3/2001 | Kim et al. | |
| 6,228,728 B1 | 5/2001 | Hokazono | |
| 6,232,196 B1 | 5/2001 | Raaijmakers et al. | |
| 6,270,572 B1 | 8/2001 | Kim et al. | |
| 6,284,646 B1 | 9/2001 | Leem | |
| 6,284,686 B1 | 9/2001 | Marlor | |
| 6,287,965 B1 | 9/2001 | Kang et al. | |
| 6,291,319 B1 | 9/2001 | Yu et al. | |
| 6,305,314 B1 | 10/2001 | Sneh et al. | |
| 6,335,280 B1 | 1/2002 | van der Jeugd | |
| 6,342,277 B1 | 1/2002 | Sherman | |
| 6,348,420 B1 | 2/2002 | Raaijmakers et al. | |
| 6,352,945 B1 | 3/2002 | Matsuki et al. | |
| 6,358,829 B2 | 3/2002 | Yoon et al. | |
| 6,383,955 B1 | 5/2002 | Matsuki et al. | |
| 6,391,785 B1 | 5/2002 | Satta et al. | |
| 6,391,803 B1 | 5/2002 | Kim et al. | |
| 6,399,491 B2 | 6/2002 | Jeon et al. | |
| 6,410,463 B1 | 6/2002 | Matsuki | |
| 6,451,119 B2 | 9/2002 | Sneh et al. | |
| 6,458,718 B1 | 10/2002 | Todd | |
| 6,462,367 B2 | 10/2002 | Marsh et al. | |
| 6,468,924 B2 | 10/2002 | Lee et al. | |
| 6,489,241 B1 | 12/2002 | Thilderkvist et al. | |
| 6,492,283 B2 | 12/2002 | Raaijmakers et al. | |
| 6,511,539 B1 * | 1/2003 | Raaijmakers | 117/102 |
| 6,534,395 B2 | 3/2003 | Werkhoven et al. | |
| 6,544,900 B2 | 4/2003 | Raaijmakers et al. | |
| 6,559,520 B2 | 5/2003 | Matsuki et al. | |
| 6,562,720 B2 | 5/2003 | Thilderkvist et al. | |
| 6,576,535 B2 | 6/2003 | Drobny et al. | |
| 6,590,344 B2 * | 7/2003 | Tao et al. | 315/111.21 |
| 6,620,670 B2 | 9/2003 | Song et al. | |
| 6,630,413 B2 | 10/2003 | Todd | |
| 6,632,279 B1 | 10/2003 | Ritala et al. | |
| 6,653,212 B1 | 11/2003 | Yamanaka et al. | |
| 6,776,841 B2 | 8/2004 | Pyi | |
| 6,797,558 B2 | 9/2004 | Nuttall et al. | |
| 6,821,825 B2 | 11/2004 | Todd | |
| 6,998,305 B2 | 2/2006 | Arena et al. | |
| 7,121,286 B2 * | 10/2006 | Nakao | 134/22.18 |
| 7,230,274 B2 | 6/2007 | O'Loughlin et al. | |
| 7,312,128 B2 * | 12/2007 | Kim et al. | 438/300 |
| 7,353,841 B2 * | 4/2008 | Kono et al. | 137/487.5 |
| 2001/0000866 A1 | 5/2001 | Sneh et al. | |
| 2001/0020712 A1 | 9/2001 | Raaijmakers et al. | |
| 2001/0024387 A1 | 9/2001 | Raaijmakers et al. | |
| 2001/0024871 A1 | 9/2001 | Yagi | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0046567 A1 | 11/2001 | Matsuki et al. | |
| 2001/0055672 A1 * | 12/2001 | Todd | 428/212 |
| 2002/0000598 A1 | 1/2002 | Kang et al. | |
| 2002/0016084 A1 | 2/2002 | Todd | |
| 2002/0022347 A1 | 2/2002 | Park et al. | |
| 2002/0031618 A1 * | 3/2002 | Sherman | 427/569 |
| 2002/0047151 A1 | 4/2002 | Kim et al. | |
| 2002/0060363 A1 | 5/2002 | Xi et al. | |
| 2002/0074588 A1 | 6/2002 | Lee | |
| 2002/0076837 A1 | 7/2002 | Hujanen et al. | |
| 2002/0090818 A1 | 7/2002 | Thilderkvist et al. | |
| 2002/0093042 A1 | 7/2002 | Oh et al. | |
| 2002/0098627 A1 | 7/2002 | Pomarede et al. | |
| 2002/0117399 A1 | 8/2002 | Chen et al. | |
| 2002/0145168 A1 | 10/2002 | Bojarczuk, Jr. et al. | |
| 2002/0155722 A1 | 10/2002 | Satta et al. | |
| 2002/0168868 A1 | 11/2002 | Todd | |
| 2002/0172768 A1 * | 11/2002 | Endo et al. | 427/255.28 |
| 2002/0173113 A1 | 11/2002 | Todd | |
| 2002/0173130 A1 | 11/2002 | Pomerede et al. | |
| 2002/0197831 A1 | 12/2002 | Todd et al. | |
| 2002/0197881 A1 | 12/2002 | Ramdani et al. | |
| 2003/0013320 A1 | 1/2003 | Kim et al. | |
| 2003/0015764 A1 | 1/2003 | Raaijmakers et al. | |
| 2003/0022528 A1 | 1/2003 | Todd | |
| 2003/0032281 A1 | 2/2003 | Werkhoven et al. | |
| 2003/0036268 A1 | 2/2003 | Brabant et al. | |
| 2003/0049942 A1 | 3/2003 | Haukka et al. | |
| 2003/0060057 A1 | 3/2003 | Raaijmakers et al. | |
| 2003/0066486 A1 | 4/2003 | Zheng et al. | |
| 2003/0072884 A1 | 4/2003 | Zhang et al. | |
| 2003/0072975 A1 | 4/2003 | Shero et al. | |
| 2003/0079677 A1 | 5/2003 | Pyi | |
| 2003/0082300 A1 | 5/2003 | Todd et al. | |
| 2003/0089308 A1 * | 5/2003 | Raaijmakers | 117/200 |
| 2003/0089942 A1 | 5/2003 | Bhattacharyya | |
| 2003/0101927 A1 * | 6/2003 | Raaijmakers | 117/200 |
| 2003/0106490 A1 | 6/2003 | Jallepally et al. | |
| 2003/0108674 A1 | 6/2003 | Chung et al. | |
| 2003/0116804 A1 | 6/2003 | Visokay et al. | |
| 2003/0124262 A1 | 7/2003 | Chen et al. | |
| 2003/0129826 A1 | 7/2003 | Werkhoven et al. | |
| 2003/0143841 A1 | 7/2003 | Yang et al. | |
| 2003/0160277 A1 | 8/2003 | Bhattacharyya | |
| 2003/0162370 A1 | 8/2003 | Sukegawa et al. | |
| 2003/0166318 A1 | 9/2003 | Zheng et al. | |
| 2003/0172872 A1 | 9/2003 | Thakur et al. | |
| 2003/0173586 A1 | 9/2003 | Moriwaki et al. | |
| 2003/0185980 A1 | 10/2003 | Endo | |
| 2003/0186561 A1 | 10/2003 | Law et al. | |
| 2003/0188682 A1 | 10/2003 | Tois et al. | |
| 2003/0189208 A1 | 10/2003 | Law et al. | |
| 2003/0189232 A1 | 10/2003 | Law et al. | |
| 2003/0190423 A1 | 10/2003 | Yang et al. | |
| 2003/0190497 A1 | 10/2003 | Yang et al. | |
| 2003/0194853 A1 | 10/2003 | Jeon | |
| 2003/0198754 A1 | 10/2003 | Xi et al. | |
| 2003/0207555 A1 | 11/2003 | Takayanagi et al. | |
| 2003/0213560 A1 | 11/2003 | Wang et al. | |
| 2003/0213977 A1 | 11/2003 | Toyoda et al. | |
| 2003/0215570 A1 | 11/2003 | Seutter et al. | |
| 2003/0216981 A1 | 11/2003 | Tillman | |
| 2003/0224566 A1 | 12/2003 | Clampitt et al. | |
| 2003/0232554 A1 | 12/2003 | Blum et al. | |
| 2003/0235961 A1 | 12/2003 | Metzner et al. | |
| 2004/0007747 A1 | 1/2004 | Visokay et al. | |
| 2004/0009307 A1 | 1/2004 | Koh et al. | |
| 2004/0009675 A1 | 1/2004 | Eissa et al. | |
| 2004/0016973 A1 | 1/2004 | Rotondaro et al. | |
| 2004/0023462 A1 | 2/2004 | Rotondaro et al. | |
| 2004/0033674 A1 | 2/2004 | Todd | |
| 2004/0033698 A1 | 2/2004 | Lee et al. | |
| 2004/0043149 A1 | 3/2004 | Gordon et al. | |
| 2004/0043569 A1 | 3/2004 | Ahn et al. | |
| 2004/0053484 A1 | 3/2004 | Kumar et al. | |
| 2004/0171238 A1 | 9/2004 | Arena et al. | |

| | | | |
|---|---|---|---|
| 2004/0175950 A1 | 9/2004 | Puppo et al. | |
| 2004/0182423 A1* | 9/2004 | Nakao | 134/22.1 |
| 2004/0226911 A1 | 11/2004 | Dutton et al. | |
| 2004/0235229 A1 | 11/2004 | Hokazono | |
| 2004/0253776 A1 | 12/2004 | Hoffmann et al. | |
| 2005/0054171 A1 | 3/2005 | Chu et al. | |
| 2005/0170604 A1 | 8/2005 | Orlowski et al. | |
| 2005/0191866 A1 | 9/2005 | Powell | |
| 2005/0241671 A1 | 11/2005 | Dong et al. | |
| 2005/0263795 A1 | 12/2005 | Choi et al. | |
| 2005/0277272 A1 | 12/2005 | Singh et al. | |
| 2006/0115933 A1 | 6/2006 | Ye et al. | |
| 2006/0115934 A1 | 6/2006 | Kim et al. | |
| 2006/0166414 A1 | 7/2006 | Carlson et al. | |
| 2006/0260538 A1 | 11/2006 | Ye | |
| 2007/0108450 A1 | 5/2007 | O'Loughlin et al. | |
| 2007/0117414 A1 | 5/2007 | Moffatt | |
| 2007/0259112 A1* | 11/2007 | Ishikawa et al. | 427/248.1 |
| 2007/0286956 A1 | 12/2007 | Samoilov | |
| 2008/0026549 A1 | 1/2008 | Kim et al. | |
| 2008/0314317 A1* | 12/2008 | Burrows et al. | 118/719 |

FOREIGN PATENT DOCUMENTS

| | | |
|---|---|---|
| EP | 1 598 881 | 11/2005 |
| GB | 2 355 727 | 5/2001 |
| JP | 58-097917 | 6/1983 |
| JP | 62-171999 | 7/1987 |
| JP | 63-062313 | 3/1988 |
| JP | 01-143221 | 6/1989 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 05-251339 | 9/1993 |
| JP | 06-196809 | 7/1994 |
| JP | 07300649 | 11/1995 |
| JP | 2001-111000 | 4/2001 |
| JP | 2001-172767 | 6/2001 |
| JP | 2001-189312 | 7/2001 |
| WO | WO 98/20524 A1 | 5/1998 |
| WO | WO 00/16377 A2 | 3/2000 |
| WO | WO 00/54320 A1 | 9/2000 |
| WO | WO 01/15220 A1 | 3/2001 |
| WO | WO 01/17692 A1 | 3/2001 |
| WO | WO 01/29893 A1 | 4/2001 |
| WO | WO 01/40541 A1 | 6/2001 |
| WO | WO 01/41544 A2 | 6/2001 |
| WO | WO 01/66832 A2 | 9/2001 |
| WO | WO 02/43115 A2 | 5/2002 |
| WO | WO 02/45167 A2 | 6/2002 |
| WO | WO 02/064853 A2 | 8/2002 |
| WO | WO 02/065508 A2 | 8/2002 |
| WO | WO 02/065516 A2 | 8/2002 |
| WO | WO 02/065517 A2 | 8/2002 |
| WO | WO 02/065525 A1 | 8/2002 |
| WO | WO 02/080244 A2 | 10/2002 |
| WO | WO 02/097864 A2 | 12/2002 |
| WO | WO 2005/071719 | 8/2005 |
| WO | WO 2007/117576 A2 | 10/2007 |

OTHER PUBLICATIONS http://en.wikipedia.org/wiki/Manifold_chemistry.*
Waite, A.M. et al., "Raised Source/Drains for 50nm MOSFETs Using A Silane/Dischlorosilane Mixture For Selective Epitaxy", Elsevier Ltd.—Solid-State Electronics 49 (2005), pp. 529-534.
Kim et al., "Low temperature selectivity Si epitaxy by reduced pressure chemical vapor deposition introducing periodic deposition and etching cycles with $SiH_4$, $H_2$ and HCl", Mat. Res. Soc. Symp. Proc., pp. A8.2.1-A8.2.6 (2000).
Mercier, et al., "Kinetic Aspects of Selective Epitaxial Growth Using a Rapid Thermal Processing System", Journal or Crystal Growth, 94, pp. 885-894 (1989).
Miyauchi, et al., "Low-Temperature (850° C.) Silicon Selective Epitaxial Growth on HF-Treated Si(100) Substrates Using $SiH_4$-$HCl$-$H_2$ Systems", J. Electrochem. Soc., vol. 138, No. 11, Nov. 1991, pp. 3480-3483.
Ribot, et al., "Low-temperature selective epitaxy of silicon with chlorinated chemistry by RTCVD", Materials Science and Engineering B89, pp. 306-309 (2002).
Agarwal, et al., "Challenges in Integrating the High-K Gate Dielectric Film to the Conventional CMOS Process Flow," Mat. Sec. Soc. Sump. Proc. vol. 670 (2001) pp. K2.1.1-K2.1.11.
Bedair, S.M., "Atomic Layer Epitaxy Deposition Processes," J. Vac. Sci. Technol. B., vol. 12, No. 1, Jan./Feb. 1994, pp. 2-8.
Choi, et al., "Stability of $TiB_2$ as a Diffusion Barrier on Silicon," J. Electrochem. Soc., vol. 138, No. 10, Oct. 1991, pp. 3062-3067.
Choi, et al., The Effect of Annealing on Resistivity of Low Pressure Chemical Vapor Deposited Titanium Diboride, J. Appl. Phys. 69(11), Jun. 1, 1991, pp. 7853-7861.
Derbyshire, K., "Applications of Integrated Processing," Solid State Technology, Dec. 1994 pp. 45-48.
Elers, et al., "$NbCl_5$ as a Precursor in Atomic Layer Epitaxy," Applied Surface Science 82/83 (1994) pp. 468-474.
George, et al., "Surface Chemistry for Atomic Layer Growth," J. Phys. Chem. 1996, 100, pp. 13121-13131.
Hwang, et al., "Nanometer-Size a-$PbO_2$-Type $TiO_2$ in Garnet: A Thermobarometer for Ultrahigh Pressure Metamorphism," Science Vo. 288 (Apr. 14, 2000) pp. 321-324.
Jeong, et al., "Growth and Characterization of Aluminum Oxide ($Al_2O_3$) Thin Films by Plasma Assisted Atomic Layer Controlled Deposition," J. Korean Inst. Met. Mater., vol. 38, No. 10, Oct. 2000 pp. 1395-1399.
Jeong, et al., "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.
Lee, et al., "Cyclic Technique for the Enhancement of Highly Oriented Diamond Film Growth," Thin Solid Films 303 (1997) pp. 264-268.
Min, et al., "Chemical Vapor Deposition of Ti-Si-N Films with Alternating Source Supply," Mat. Res. Soc. Symp. Proc. vol. 564 (1999) pp. 207-210.
Min, et al., "Metal-organic Atomic-layer Deposition of Titanium-silicon-nitride Films," Applied Physics Letters, vol. 75, No. 11 (Sep. 11, 1999) pp. 1521-1523.
Paranjpe, et al., "Atomic Layer Deposition of $AlO_x$ for Thin Film Head Gap Applications," J. Electrochem. Soc., vol. 148, No. 9, Sep. 2001 pp. G465-G471.
Ritala, et al., "Atomic Layer Deposition of Oxide Thin Films with Metal Alkoxides as Oxygen Sources," Science vol. 288 Apr. 14, 2000 pp. 319-321.
Kamins, et al., "Kinetics of selective epitaxial deposition of $Si_{1-x}Ge_x$", Applied Physics Letters, American Institute of Physics. New York, US, vol. 61, No. 6, Aug. 10, 1992, pp. 669-671.
Menon, et al., "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.
Sedgwick, et al., "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.
Uchino, et al., "A Raised Source/Drain Technology Using In-situ P-doped SiGe and B-doped Si for 0.1 µm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.
Maruno et al., "Selective Epitaxial Growth by Ultrahigh-Vacuum Chemical Vapor Deposition with Alternating Gas Supply of $Si_2H_6$ and $Cl_2$", Nov. 2000, Japanese Journal of Applied Physics, vol. 39, No. 11, Part 1, pp. 6139-6142.

International Search Report and Written Opinion of International Application No. PCT/US07/17193 (10595/PCT) mailed Jan. 31, 2008.

International Search Report and Written Opinion of International Application No. PCT/US07/08549 (10318/PCT) mailed Jun. 13, 2008.

International Search Report and Written Opinion of International Application No. PCT/US07/08541 (10302/PCT) mailed Aug. 8, 2008.

International Search Report and Written Opinion of International Application No. PCT/US07/07363 (10303/PCT) mailed Aug. 15, 2008.

International Preliminary Report on Patentability and Written Opinion of International Application No. PCT/US2007/008541 (10302/PCT) mailed Oct. 16, 2008.

* cited by examiner

GAS MANIFOLDS FOR USE DURING EPITAXIAL FILM FORMATION

CROSS REFERENCE TO RELATED APPLICATION

This application claims priority to U.S. Provisional Patent Application Ser. No. 60/790,227, filed Apr. 7, 2006, entitled "Gas Manifolds For Use During Epitaxial Film Formation." This application is also related to U.S. Provisional Patent Application Ser. No. 60/790,066, filed Apr. 7, 2006, entitled "Cluster Tool For Epitaxial Film Formation," U.S. patent application Ser. No. 11/047,323, filed Jan. 31, 2005, now U.S. Pat. No. 7,235,492, and U.S. patent application Ser. No. 11/227,974, filed Sep. 14, 2005, which is US PG Pub 2006/0115933, which is a continuation-in-part of and claims priority to U.S. patent. application Ser. No. 11/001,774, filed Dec. 1, 2004 now U.S. Pat. No. 7,312,128. Each of the above applications is hereby incorporated by reference herein in its entirety.

FIELD OF THE INVENTION

The present invention relates generally to semiconductor device manufacturing, and more particularly to gas manifolds for use during epitaxial film formation.

BACKGROUND

A conventional selective epitaxy process involves a deposition reaction and an etch reaction. The deposition and etch reactions occur concurrently with relatively different reaction rates to an epitaxial layer and to a polycrystalline layer. During the deposition process, the epitaxial layer is formed on a monocrystalline surface while a polycrystalline layer is deposited on at least a second layer, such as an existing polycrystalline layer and/or an amorphous layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

Selective epitaxy processes generally have some drawbacks. In order to maintain selectivity during such epitaxy processes, chemical concentrations of the precursors, as well as reaction temperatures must be regulated and adjusted throughout the deposition process. If not enough silicon precursor is administered, then the etching reaction may dominate and the overall process is slowed down. Also, harmful over etching of substrate features may occur. If not enough etchant precursor is administered, then the deposition reaction may dominate reducing the selectivity to form monocrystalline and polycrystalline materials across the substrate surface. Also, conventional selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface.

As an alternative to a conventional selective epitaxy process, previously incorporated U.S. patent application Ser. No. 11/001,774, filed Dec. 1, 2004 describes an alternating gas supply (AGS) process that includes repeating a cycle of a deposition process and an etching process until the desired thickness of an epitaxial layer is formed. Because an AGS process uses separate deposition and etching steps, deposition precursor concentrations need not be maintained during etching steps and etching precursor concentrations need not be maintained during deposition steps. In some cases, lower reaction temperatures may be employed.

For both selective epitaxy and AGS processes, a need remains for a system for efficiently practicing such processes.

SUMMARY OF THE INVENTION

In some aspects, the present invention provides an epitaxial film formation system that includes an epitaxial chamber adapted to form an epitaxial layer on a substrate; a deposition gas manifold adapted to supply at least one deposition gas and a carrier gas to the epitaxial chamber; and an etchant gas manifold separate from the deposition gas manifold and adapted to supply at least one etchant gas and a carrier gas to the epitaxial chamber.

In other aspects, the present invention provides a method of forming an epitaxial film that includes supplying at least one deposition gas and a carrier gas to an epitaxial chamber from a deposition gas manifold; and supplying at least one etchant gas and a carrier gas to the epitaxial chamber from an etchant gas manifold separate from the deposition gas manifold.

In yet other aspects, the present invention provides an apparatus for use in forming an epitaxial film that includes a mixing junction coupled to an epitaxial chamber adapted to form an epitaxial layer on a substrate, a deposition gas manifold adapted to supply at least one deposition gas and a carrier gas to the epitaxial chamber, and an etchant gas manifold, separate from the deposition gas manifold, and adapted to supply at least one etchant gas and a carrier gas to the epitaxial chamber.

In yet still other aspects, the present invention provides an apparatus for use in forming an epitaxial film that includes a mixing chamber coupled to an epitaxial chamber adapted to form an epitaxial layer on a substrate, a deposition gas manifold adapted to supply at least one deposition gas and a carrier gas to the epitaxial chamber, and an etchant gas manifold, separate from the deposition gas manifold, and adapted to supply at least one etchant gas and a carrier gas to the epitaxial chamber.

Other features and aspects of the present invention will become more fully apparent from the following detailed description, the appended claims and the accompanying drawings.

DETAILED DESCRIPTION

Conventional epitaxial film formation systems generally use a single deposition and etch gas manifold because etch and deposition steps are performed simultaneously. In an alternating gas supply (AGS) epitaxial film formation system, deposition and etch steps are performed sequentially. Exemplary AGS systems are described in U.S. patent application Ser. No. 11/001,774, filed Dec. 1, 2004 and U.S. patent application Ser. No. 11/227,974, filed Sep. 14, 2005, which are hereby incorporated by reference herein in there entirety.

In AGS systems it may be desirable to have a separate etchant and deposition manifold so that deposition and etch gases are immediately available to an epitaxial chamber when switching from deposition to etch and vice versa. The present invention provides methods and apparatus for employing separate etchant and deposition manifolds.

Figure 1:
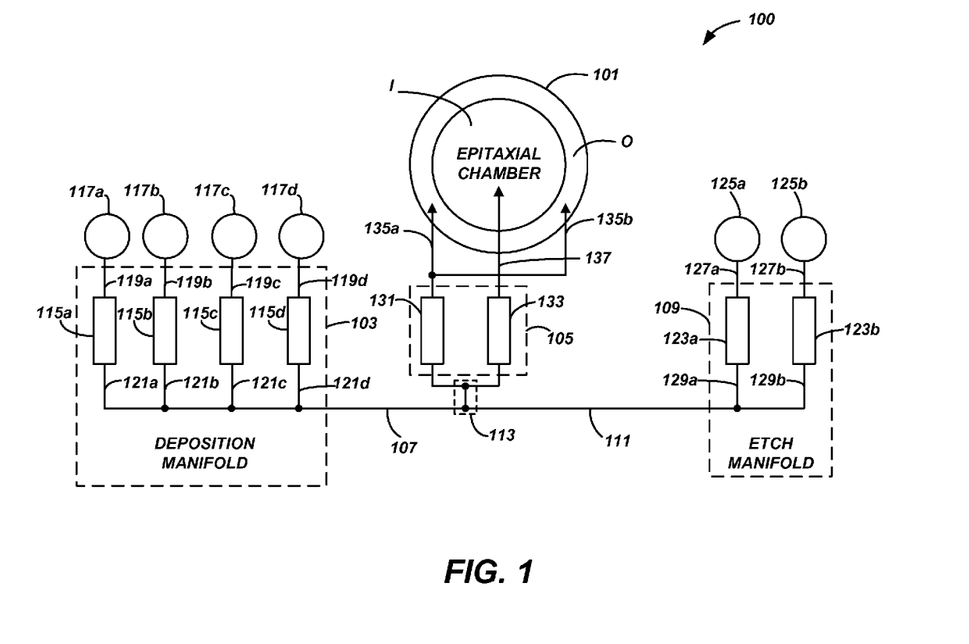
FIG. 1 is a schematic drawing of a first exemplary epitaxial film formation system in accordance with an embodiment of the present invention.

FIG. 1 is a schematic drawing of a first exemplary epitaxial film formation system 100 (hereinafter 'first Epi system 100') in accordance with an embodiment of the present invention. The first Epi system 100 may include an epitaxial chamber 101 coupled to (1) a deposition manifold 103 via a chamber valve system 105 and a deposition gas line 107; and (2) an etchant manifold 109 via the chamber valve system 105 and an etchant gas line 111. As shown in FIG. 1, the chamber valve system 105, the deposition gas line 107 and the etchant gas line 111 are coupled at a mixing junction 113 (e.g., a t-junction or similar connection).

In accordance with an embodiment of the present invention, the epitaxial chamber 101 may comprise any conventional epitaxial chamber adapted for forming epitaxial films on one or more substrates. An exemplary epitaxial chamber may be found in the Epi Centura® system and the Poly Gen® system available from Applied Materials, Inc., located in Santa Clara, Calif., although other epitaxial chambers and/or systems may be used.

With reference to FIG. 1, the deposition manifold 103 may include flow controllers 115a-d (e.g., mass flow controllers (MFC), volume flow controllers (VFC), valves, etc.). The flow controllers 115a-d may be coupled to gas sources 117a-d (e.g., gas bottles and/or facility lines, etc.) via a first set of gas lines 119a-d. The flow controllers 115a-d may also be coupled to the deposition gas line 107 via a second set of gas lines 121a-d. The gas lines 119a-d, 121a-d and the deposition gas line 107 may comprise stainless steel tubing or other suitable tubing/piping (e.g., AISI 316L, etc.).

In the embodiment of FIG. 1, the deposition manifold 103 may include four flow controllers 115a-d coupled to four gas sources 117a-d. However, there may be more or less than four flow controllers 115a-d. In addition, there may be more or less than four gas sources 117a-d coupled to the flow controllers 115a-d. For example, a source of a gas (e.g., N2, silane, HCl, etc.) may be coupled to more than one flow controller and/or more than one source of gas may be coupled to a flow controller.

The flow controllers 115a-d may be joined with the gas lines 119a-d and 121a-d by employing compressible gaskets, for example, although any suitable connection devices may be employed. The flow controllers 115a-d may be the same or different from each other. Additionally, the flow controllers 115a-d may control flow based on mass, volume, time (e.g., turning on and off a pneumatic valve based on time), etc.

FIG. 1 depicts the gas sources 117a-d as being disposed external to the deposition manifold 103. However, the gas sources 117a-d may be included in the deposition manifold 103. The gas sources 117a-d (e.g., gas bottles, etc.) may be disposed in a sub-fab or other such location outside a semiconductor device manufacturing clean room or chase. Alternatively, the gas sources 117a-d may be disposed near or within a cluster tool in the semiconductor device fabrication clean room and/or chase. Further, the gas sources 117a-d may be provided by facilities of a semiconductor device fabrication plant. Chemical compounds housed and/or carried by the gas sources 117a-d may be in gaseous, liquid and/or solid form and may subsequently be evaporated into a gaseous form for use in the epitaxial chamber 101 to form an epitaxial film.

With reference to FIG. 1, the etchant manifold 109 may include flow controllers 123a-d (e.g., mass flow controllers (MFC), volume flow controllers (VFC), valves, etc.). The flow controllers 123a-b may be coupled to gas sources 125a-b (e.g., gas bottles, facility lines, etc.) via a first set of gas lines 127a-b. The flow controllers 123a-b may also be coupled to the etchant gas line 111 via a second set of gas lines 129a-b. The gas lines 127a-b and 129a-b and the etchant gas line 111 may comprise stainless steel tubing or other suitable tubing/piping (e.g., AISI 316L, etc.).

In the embodiment of FIG. 1, the etchant manifold 109 may include two flow controllers 123a-b coupled to two gas sources 127a-b. However, there may be more or less than two flow controllers 123a-b. In addition, there may be more or less than two gas sources 125a-b coupled to the flow controllers 123a-b. For example, a source of a gas (e.g., N2, HCl, C12, etc.) may be coupled to more than one flow controller and/or more than one source of gas may be coupled to a flow controller.

The flow controllers 123a-b may be joined with the gas lines 127a-b and 129a-b by employing compressible gaskets, for example, although any suitable connection devices may be employed. Additionally, the flow controllers 123a-b may be the same or different from each other. The flow controllers 123a-b may control flow based on mass, volume, time (e.g., turning on and off a pneumatic valve based on time), etc.

FIG. 1 depicts the gas sources 125a-b as being disposed external to the etchant manifold 109. However, the gas sources 125a-b may be included in the etchant manifold 109. The gas sources 125a-b (e.g., gas bottles, etc.) may be disposed in a sub-fab or other such location outside a semiconductor device manufacturing clean room or chase. Alternatively, the gas sources 125a-b may be disposed near or within a cluster tool in the semiconductor device fabrication clean room and/or chase. Further, the gas sources 125a-b may be provided by facilities of a semiconductor device fabrication plant. Chemical compounds housed and/or carried by the gas sources 125a-b may be in gaseous, liquid and/or solid form and may subsequently be evaporated into a gaseous form for use in the epitaxial chamber 101 to form an epitaxial film.

The chamber valve system 105 may include an outer chamber flow controller 131 and an inner chamber flow controller 133. The outer chamber flow controller 131 may be coupled to an outer region O of the epitaxial chamber 101 via outer chamber gas lines 135a-b (e.g. stainless steel or similar piping/tubing). The inner chamber flow controller 133 may be coupled to an inner region I of the epitaxial chamber 101 by an inner chamber gas line 137 (e.g., stainless steel or similar piping/tubing). Note that the inner region I and outer region O of the epitaxial chamber 101 depicted in FIG. 1 are not drawn to scale and are merely representative. The relative size and location of the inner region I and outer region O may vary according to the use of the epitaxial chamber 101.

The outer chamber flow controller 131 and inner chamber flow controller 133 may be joined with the mixing junction 113 using welding or any other suitable method. The outer chamber flow controller 131 and inner chamber flow controller 133 may be MFCs, volume flow controllers, valves (e.g. pneumatic), etc. The outer chamber flow controller 131 may also be joined with the gas lines 135a-b using welding or other suitable methods.

The mixing junction 113 may be a conventional t-junction to which the gas lines 107 and 111 may be joined. The mixing junction 113 may also include other geometries. For example, rather than employing a t-junction, a y-junction may be employed, as may differing and/or variable dimensions of the portion of a junction that mixes the gases. Alternatively, the junction may be an x-junction in which different branches may be respectively coupled to the outer chamber flow controller 131, inner chamber flow controller 133, deposition gas line 107 and etchant gas line 111. Depending on the gas sources employed, selection of a particular geometry and/or volume arrangement may improve the uniformity of the mixture of the gases in the mixing junction 113.

Through use of separate deposition and etchant manifolds 103, 109, during an AGS process, gases used during etching are immediately available to the epitaxial chamber 101 following deposition. Likewise, gases used during deposition are immediately available to the epitaxial chamber 101 following etching. Note that carrier gas (e.g., N2, H2, etc.) may be continuously flowed from both the deposition manifold 103 and the etchant manifold 109 during deposition and etching to avoid flow spikes due to turning the carrier gas on/off. For example, the carrier gas flow rate may be much larger than the etchant/source flow rates (e.g., about 10-20 slm for a carrier gas versus about 1 slm or less for etchant/deposition gasses in at least one embodiment). In one exemplary embodiment, a carrier gas flow rate of about 10 slm is continuously flowed from each of the deposition manifold 103 and the etchant manifold 109, although other flow rates may be used.

Figure 2:
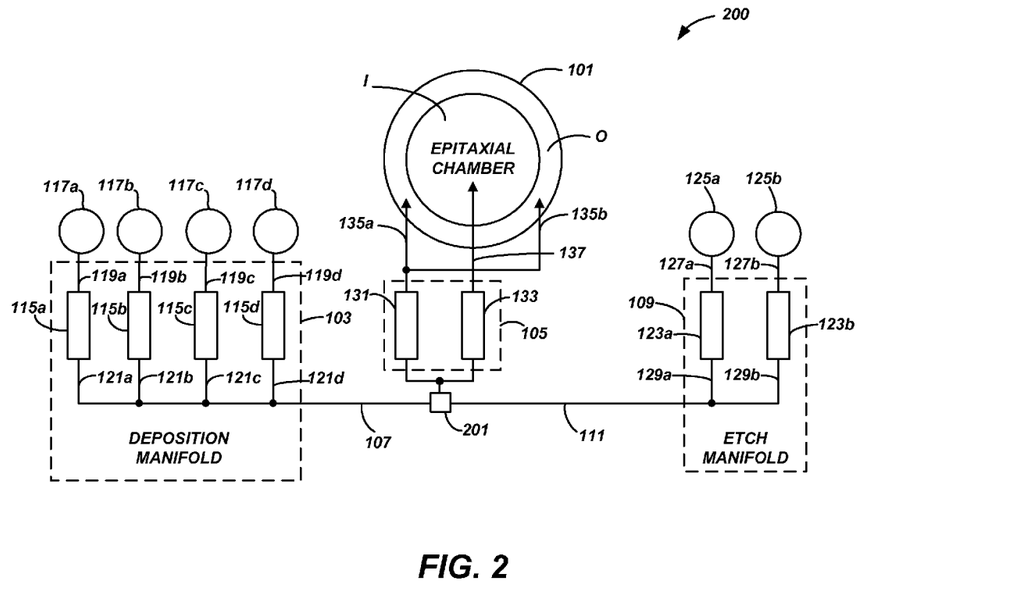
FIG. 2 is a schematic drawing of a second exemplary epitaxial film formation system in accordance with an embodiment of the present invention.

FIG. 2 is a schematic drawing of a second exemplary epitaxial film formation system 200 (hereinafter 'second Epi system 200') in accordance with an embodiment of the present invention. The second Epi system 200 of FIG. 2 is similar to the first epi system 100 of FIG. 1, but employs a mixing chamber 201 in place of the mixing junction 113 of the first Epi system 100 of FIG. 1. As shown in FIG. 2, the chamber valve system 105, the deposition gas line 107 and the etchant gas line 111 are coupled to the mixing chamber 201.

The mixing chamber 201 may be any chamber shape/size that improves gas mixing prior to entry into the epitaxial chamber 101. For example, the mixing chamber 201 may be cylindrical, cubical, spherical or the like.

The second Epi system 200 operates similarly to the first Epi system 100 of FIG. 1. However, because of the mixing chamber 201, improved mixing of gases occurs prior to entry of the gases into the epitaxial chamber 101. In some embodiments, such improved gas mixing may improve epitaxial film surface morphology (e.g., by more uniformly mixing carrier gas and etchant and/or deposition gases prior to entry into the epitaxial chamber 101).

Figure 3:
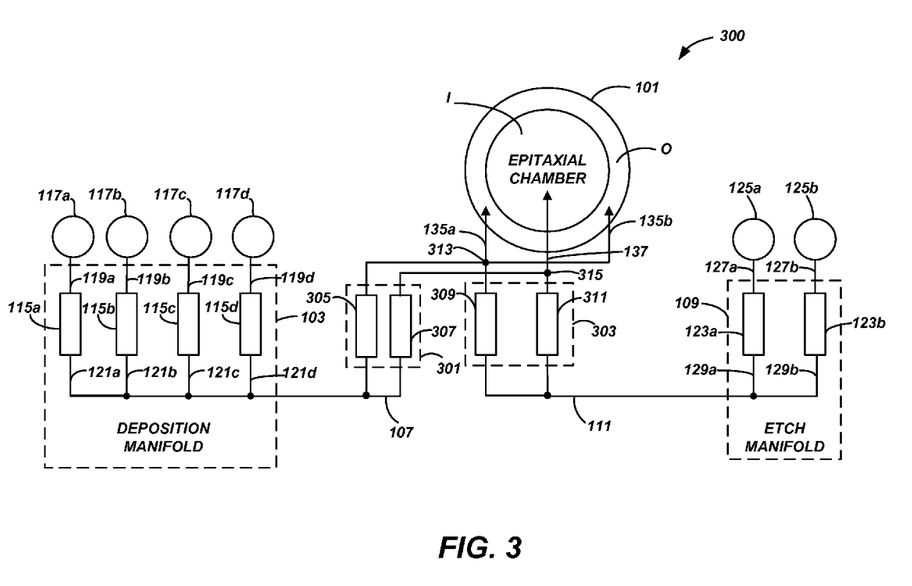
FIG. 3 is a schematic drawing of a third exemplary epitaxial film formation system in accordance with an embodiment of the present invention.

FIG. 3 is a schematic drawing of a third exemplary epitaxial film formation system 300 (hereinafter 'third Epi system 300') in accordance with an embodiment of the present invention. The third Epi system 300 of FIG. 3 is similar to the first epi system 100 of FIG. 1, but replaces the chamber valve system 105 with a deposition valve system 301 and an etchant valve system 303.

The deposition valve system 301 has an outer chamber flow controller 305, and an inner chamber flow controller 307. Likewise, the etchant valve system 303 includes an outer chamber flow controller 309, and an inner chamber flow controller 311.

The third Epi system 300 may also replace the mixing junction 113 of FIG. 1 with an outer chamber mixing junction 313 and an inner chamber mixing junction 315. Both the outer chamber flow controller 305 of the deposition valve system 301 and the outer chamber flow controller 309 of the etchant valve system 303 are coupled to the outer chamber mixing junction 313. Both the inner chamber flow controller 307 of the deposition valve system 301 and the inner chamber flow controller 311 of the etchant valve system 303 are coupled to the inner chamber mixing junction 315.

As shown in FIG. 3, the deposition gas line 107 is coupled to the outer chamber flow controller 305 and the inner chamber flow controller 307 of the deposition valve system 301. The etchant gas line 111 is coupled to the outer chamber flow controller 309 and the inner chamber flow controller 311 of the etchant valve system 303. The flow controllers 305, 307, 309 and 311 may be MFCs, volume flow controllers, valves (e.g. pneumatic), or any other suitable flow controllers.

The third Epi system 300 operates similarly to the first Epi system 100 of FIG. 1. However, placement of the mixing junctions 313, 315 closer to the epitaxial chamber 101 (relative to the mixing junction 313 of FIG. 1) may improve gas mixing in some embodiments. In at least one embodiment of the invention, the flow controllers 305, 307, 309 and 311 are each set to a desired position/flow rate and are kept open during film formation (e.g., to avoid delays and/or spikes). For example, only the flow controllers 115a-d and/or 123a-b need be opened and closed.

Figure 4:
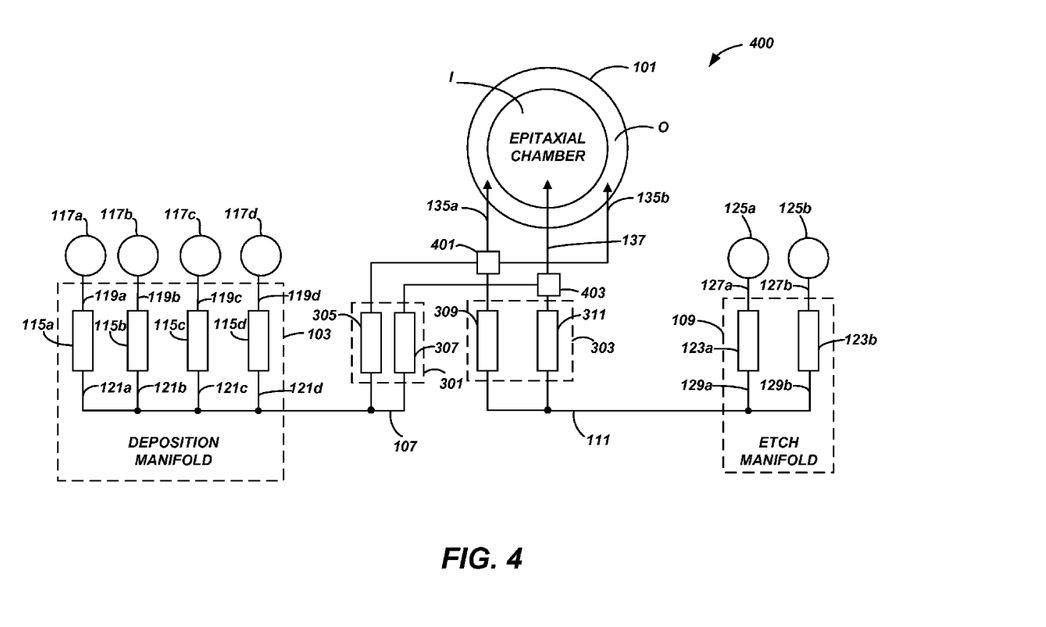
FIG. 4 is a schematic drawing of a fourth exemplary epitaxial film formation system in accordance with an embodiment of the present invention.

FIG. 4 is a schematic drawing of a fourth exemplary epitaxial film formation system 400 (hereinafter 'fourth Epi system 400') in accordance with an embodiment of the present invention. The fourth Epi system 400 of FIG. 4 is similar to the third epi system 300 of FIG. 3, but replaces the outer chamber mixing junction 313 with an outer mixing chamber 401 and the inner chamber mixing junction 315 with an inner mixing chamber 403. Thus, the outer chamber flow controller 305 of the deposition valve system 301 and the outer chamber flow controller 309 of the etchant valve system 303 are coupled to the outer mixing chamber 401. Likewise, the inner chamber flow controller 307 of the deposition valve system 301 and the inner chamber flow controller 311 of the etchant valve system 303 are coupled to the inner mixing chamber 403.

The mixing chambers 401, 403 may be any chamber shape/size that improves gas mixing prior to entry into the epitaxial chamber 101. For example, the mixing chambers 401, 403 may be cylindrical, cubical, spherical or the like.

The fourth Epi system 400 operates similarly to the third Epi system 300 of FIG. 3. However, because of the mixing chambers 401, 403, improved mixing of gases occurs prior to entry of the gases into the epitaxial chamber 101. In some embodiments, such improved gas mixing may improve epitaxial film surface morphology (e.g., by more uniformly mixing carrier gas and etchant and/or deposition gases prior to entry into the epitaxial chamber 101).

The foregoing description discloses only exemplary embodiments of the invention. Modifications of the above disclosed apparatus and methods which fall within the scope of the invention will be readily apparent to those of ordinary skill in the art. For instance, while the deposition manifold 103 and etchant manifold 109 are shown on opposite sides of the epitaxial chamber 101, it will be understood that the deposition manifold 103 and etchant manifold 109 may be on the same side of the epitaxial chamber 101 or in any other suitable location (e.g., while remaining separate manifolds). Furthermore, the deposition manifold 103 and etchant manifold 109 may be part of an overall gas manifold that employs a separate etchant line to deliver etchants to a processing chamber (independently of the line used to deliver deposition species) as described above in FIGS. 1-4.

In at least one embodiment of the invention, injection of etchant (e.g., C12) occurs through an independent fluid supply line, without mixing with other gases in a gas panel (e.g., source gases, deposition gases, etc.). For example, injection of etchant may occur through an independent line with a flow control device.

In one particular embodiment, injection of etchant may occur through an independent line with a flow control device, with the line split near a processing chamber (e.g., an epitaxial film formation chamber) to divide the etchant between injection zones of the chamber, in order to achieve desired uniformity of etching. In some embodiments, a flow divider or a valve may be used on each of the splits.

In some embodiments, injection of etchant may occur through an independent line, without mixing with other gases in a gas panel, with a mixer near the processing chamber (e.g., an epitaxial film formation chamber).

In at least one embodiment, injection of etchant may occur, with a separate line from the gas panel to the processing chamber for each of the injection zones of the chamber. For example, injection of etchant may occur, with a separate line from the gas panel to the processing chamber for each of the injection zones of the chamber, with a mixer near the processing chamber. In some embodiments, injection of etchant may occur, with a separate line from the gas panel to the processing chamber, with only a carrier gas, such as N2, He, Ar, etc., connected to the etchant line at the gas panel.

In some embodiments, injection of etchant may occur, in which the mixing of the etchant with other active chemicals (e.g., liquids) required for the process takes place at a point where the pressure in the line does not exceed the chamber pressure by about 20 Torr.

In at least one embodiment, C12 may be employed for epitaxial film formation, cleaning, and/or etching Si-containing materials (preferably at a chamber pressure of about 1 Torr or above).

In some embodiments, injection of etchant may occur, where the etchant is mixed with other gases/liquids such as Si precursors, dopant gases, etc., in a gas panel for deposition, cleaning, and/or etching of Si-containing materials (preferably at chamber pressure of about 1 Torr or above). For example, a thermal processing chamber may be provided for using an etchant (e.g., C12) for deposition, cleaning, and/or etching of Si-containing materials (preferably at a chamber pressure of about 1 Torr or above). A tool comprising a gas panel, a processing chamber, and delivery lines connected to the processing chamber from the gas panel may use an etchant (e.g., C12) for deposition, cleaning, and/or etching of Si-containing materials, preferably at a chamber pressure of about 1 Torr or above.

In some embodiments, injection of etchant may occur, where the etchant is mixed with the rest of the liquids (such as Si precursors, dopant gases, etc.) in the gas panel. In at least one embodiment, injection of etchant may occur through an independent line with a flow control device, with the line split near the chamber to divide the etchant between injection zones of the chamber, upstream from the metering valves. The same metering valves may be used to vary distribution of the etchant and the rest of the processing gases between the injection zones of the chamber. In some embodiments, injection of etchant may occur, with a separate line from the gas panel to the processing chamber for each of the injection zones of the chamber, with a mixer near the processing chamber.

Accordingly, while the present invention has been disclosed in connection with exemplary embodiments thereof, it should be understood that other embodiments may fall within the spirit and scope of the invention, as defined by the following claims.

The invention claimed is:

1. An epitaxial film formation system comprising:
a deposition gas manifold connected to a mixing junction through a first conduit;
an etchant gas manifold connected to the mixing junction through a second conduit;
a flow controller connected to the mixing junction through a third conduit; and
an epitaxial chamber connected to the flow controller through a fourth conduit;
wherein:
the deposition gas manifold is adapted to supply a deposition gas to the mixing junction;
the etchant gas manifold is adapted to supply an etchant gas to the mixing junction;
the mixing junction is adapted to flow gas to the flow controller;
the flow controller is adapted to receive the gas from the mixing junction and flow the gas to the epitaxial chamber; and
the epitaxial chamber is adapted to form an epitaxial layer on a substrate.

2. The epitaxial film formation system of claim 1, wherein the mixing junction comprises a mixing chamber.

3. The epitaxial film formation system of claim 1, wherein the deposition gas manifold is further adapted to supply a carrier gas.

4. The epitaxial film formation system of claim 1, wherein the etchant gas manifold is further adapted to supply a carrier gas.

5. The epitaxial film formation system of claim 1, further comprising:
an additional flow controller connected to the mixing junction through a fifth conduit and to the epitaxial chamber through a sixth conduit;
wherein:
the mixing junction is further adapted to flow the gas to the additional flow controller; and
the additional flow controller is adapted to flow the gas to the epitaxial chamber.

6. The epitaxial film formation system of claim 5, wherein:
the epitaxial chamber comprises a first zone and a second zone;
the flow controller is further adapted to flow the gas to the first zone of the epitaxial chamber; and
the additional flow controller further is adapted to supply the gas to the second zone of the epitaxial chamber.

7. An epitaxial film formation system comprising:
a deposition gas manifold;
a first flow controller connected to the deposition gas manifold through a first conduit;
an etchant gas manifold;
a second flow controller connected to the etchant gas manifold through a second conduit;
a mixing junction connected to the first flow controller through a third conduit and to the second flow controller through a fourth conduit; and
an epitaxial chamber connected to the mixing junction through a fifth conduit;
wherein:
the deposition gas manifold is adapted to supply a deposition gas to the first flow controller;
the etchant gas manifold is adapted to supply an etchant gas to the second flow controller;

the first flow controller is adapted to flow the deposition gas to the mixing junction;

the second flow controller is adapted to flow the etchant gas to the mixing junction;

the mixing junction is adapted to flow gas to the epitaxial chamber; and the epitaxial chamber is adapted to form an epitaxial film on a substrate.

8. The epitaxial film formation system of claim 7 wherein the mixing junction comprises a mixing chamber.

9. The epitaxial film formation system of claim 7, wherein the deposition gas manifold is further adapted to supply a carrier gas.

10. The epitaxial film formation system of claim 7, wherein the etchant gas manifold is further adapted to supply a carrier gas.

11. The epitaxial film formation system of claim 7, further comprising:

a third flow controller connected to the deposition gas manifold through a sixth conduit;

a fourth flow controller connected to the etchant gas manifold through a seventh conduit; and an additional mixing junction connected to the third flow controller through an eighth conduit, and to the fourth flow controller through a ninth conduit;

wherein the additional mixing junction is connected to the epitaxial chamber through a tenth conduit.

12. The epitaxial film formation system of claim 11 wherein:

the epitaxial chamber comprises a first zone and a second zone;

the deposition gas manifold is further adapted to supply the deposition gas to the third controller;

the etchant gas manifold is further adapted to supply the etchant gas to the fourth controller;

the third controller is adapted to flow gas to the additional mixing junction;

the fourth controller is adapted to flow gas to the additional mixing junction;

the mixing junction is further adapted to flow the gas to the first zone of the epitaxial chamber; and the additional mixing junction is adapted to flow the gas to the second zone of the epitaxial chamber.

* * * * *